US008188493B2

(12) United States Patent
Li et al.

(10) Patent No.: US 8,188,493 B2
(45) Date of Patent: May 29, 2012

(54) LIGHT EMITTING DIODE WITH INDEPENDENT ELECTRODE PATTERNS

(75) Inventors: Fang-I Li, Tao-Yuan Hsien (TW); Wei-Kang Cheng, Tao-Yuan Hsien (TW); Chih-Hsuan Lu, Tao-Yuan Hsien (TW); Yi-Sheng Ting, Tao-Yuan Hsien (TW); Shyi-Ming Pan, Tao-Yuan Hsien (TW)

(73) Assignee: Formosa Epitaxy Incorporation, Lung-Tan Ind. Park, Lung-Tan, Tao-Yuan, Hsien (TW)

( * ) Notice: Subject to any disclaimer, the term of this patent is extended or adjusted under 35 U.S.C. 154(b) by 0 days.

(21) Appl. No.: 12/959,398

(22) Filed: Dec. 3, 2010

(65) Prior Publication Data
US 2012/0061711 A1    Mar. 15, 2012

(30) Foreign Application Priority Data
Sep. 14, 2010   (TW) ................................ 99130980 A

(51) Int. Cl.
*H01L 33/38*    (2010.01)

(52) U.S. Cl. ...................... 257/91; 257/99; 257/E33.065

(58) Field of Classification Search ....................... 257/91
See application file for complete search history.

(56) References Cited

U.S. PATENT DOCUMENTS

| 6,518,598 | B1 * | 2/2003 | Chen | 257/91 |
| 6,583,448 | B2 * | 6/2003 | Lin et al. | 257/99 |
| 6,614,056 | B1 * | 9/2003 | Tarsa et al. | 257/91 |
| 6,853,011 | B2 * | 2/2005 | Lin | 257/99 |
| 7,488,988 | B2 * | 2/2009 | Lin et al. | 257/94 |
| 2003/0218176 | A1 * | 11/2003 | Zhao et al. | 257/81 |
| 2005/0205875 | A1 * | 9/2005 | Shei et al. | 257/79 |
| 2006/0192223 | A1 * | 8/2006 | Lee et al. | 257/99 |
| 2007/0090377 | A1 * | 4/2007 | Lin et al. | 257/94 |
| 2007/0145381 | A1 * | 6/2007 | Unno et al. | 257/79 |
| 2008/0210972 | A1 * | 9/2008 | Ko et al. | 257/99 |
| 2008/0230791 | A1 * | 9/2008 | Lin et al. | 257/91 |
| 2010/0006885 | A1 * | 1/2010 | Gong | 257/99 |

* cited by examiner

*Primary Examiner* — Nathan Ha
*Assistant Examiner* — Abul Kalam
(74) *Attorney, Agent, or Firm* — Winston Hsu; Scott Margo

(57) ABSTRACT

Abstract of Disclosure

A light emitting diode includes a substrate, an N-doped layer disposed on the substrate, a plurality of cathodes disposed between the N-doped layer and the substrate, an active layer disposed on the N-doped layer, a P-doped layer disposed on the active layer, and a plurality of anodes disposed on the P-doped layer. The cathodes are electrically connected to the N-doped layer, and the patterns of the cathodes are disconnected from each other. The anodes are electrically connected to the P-doped layer, and the patterns of the anodes are disconnected from each other. Each cathode and a corresponding anode form a loop, and each loop is an independent loop.

10 Claims, 4 Drawing Sheets

LIGHT EMITTING DIODE WITH INDEPENDENT ELECTRODE PATTERNS

BACKGROUND OF THE INVENTION

1. Field of the Invention

The present invention relates to a light emitting diode, and more particularly, to a light emitting diode with a plurality of independent cathode patterns disposed disconnectedly to each other and a plurality of independent anode patterns disposed disconnectedly to each other.

2. Description of the Prior Art

Because of certain advantages, such as eco-friendly property, higher electric luminous efficacy, lower volume, longer life time, stable wavelength, and less production of heat, light emitting diodes are widely used in surroundings. Light emitting diodes gradually replace the conventional light source in many applications, such as huge display boards in cities, traffic signals on streets, indication lamps on electric equipments, and backlight modules of display panels. As the range of the application expands, demands for better uniformity of luminance in light emitting diodes have been grown rapidly.

Please refer to FIG. 1. FIG. 1 is a schematic diagram illustrating a conventional light emitting diode. As shown in FIG. 1, the conventional light emitting diode 1 comprises a substrate 10, an N-doped layer 12 disposed on the substrate 10, a P-doped layer 14 disposed on the N-doped layer 12, an active layer disposed between the N-doped layer 12 and the P-doped layer 14, a cathode 18 disposed on the N-doped layer 12, and an anode 20 disposed on the P-doped layer 14.

Uniformity of electric currents in light emitting diodes is one of the main factors that influence the uniformity of luminance and luminous efficacy in light emitting diodes. As shown in FIG. 1, the anode 20 of the conventional light emitting diode 1 is disposed on the P-doped layer 14, and the cathode 18 is disposed on the N-doped layer 12. When the light emitting diode 1 emits light, the electric current, which is used to drive the light emitting diode 1, is generated from the anode 20 and orderly passes through the P-doped layer 14, the active layer 16, the N-doped layer 12 and the cathode 18 to form a loop. When applied in small-sized light emitting diodes, a distribution of the current in the conventional light emitting diodes may still be uniform. When applied in big-sized light emitting diodes, such as a light emitting diode with a length longer than 1000 micrometers, the electrode design of the conventional light emitting diode 1 may not generate uniformly distributing currents, and demerits such as non-uniform luminance and low luminous efficacy may be generated and need to be further improved.

SUMMARY OF THE INVENTION

It is one of the objectives of the present invention to provide a light emitting diode to enhance the uniformity of luminance and the luminous efficacy.

The present invention provides a light emitting diode comprising a substrate, a first doped layer disposed on the substrate, a first electrode and a second electrode disposed between the first doped layer and the substrate, an active layer disposed on the first doped layer, a second doped layer disposed on the active layer, and a third electrode and a fourth electrode disposed on the second doped layer. The first electrode and the second electrode are electrically connected to the first doped layer, and the third electrode and the fourth electrode are electrically connected to the second doped layer. A pattern of the first electrode is disconnected to a pattern of the second electrode, and a pattern of the third electrode is disconnected to a pattern of the fourth electrode.

The present invention provides another light emitting diode comprising a substrate, an N-doped layer disposed on the first substrate, a plurality of cathodes disposed between the N-doped layer and the substrate, an active layer disposed on the N-doped layer, a P-doped layer disposed on the active layer, and a plurality of anodes disposed on the P-doped layer. The cathode is electrically connected to the N-doped layer, and patterns of the cathode are disconnected to each other. The anode is electrically connected to the P-doped layer, and patterns of the anode are disconnected to each other.

The light emitting diode in the present invention comprises a plurality of loop regions, and an independent loop is formed by independent cathodes and independent anodes in each of the loop regions. Because of the independent loops, the distribution of the currents may be more uniform, and the uniformity of luminance and the luminous efficacy may be enhanced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
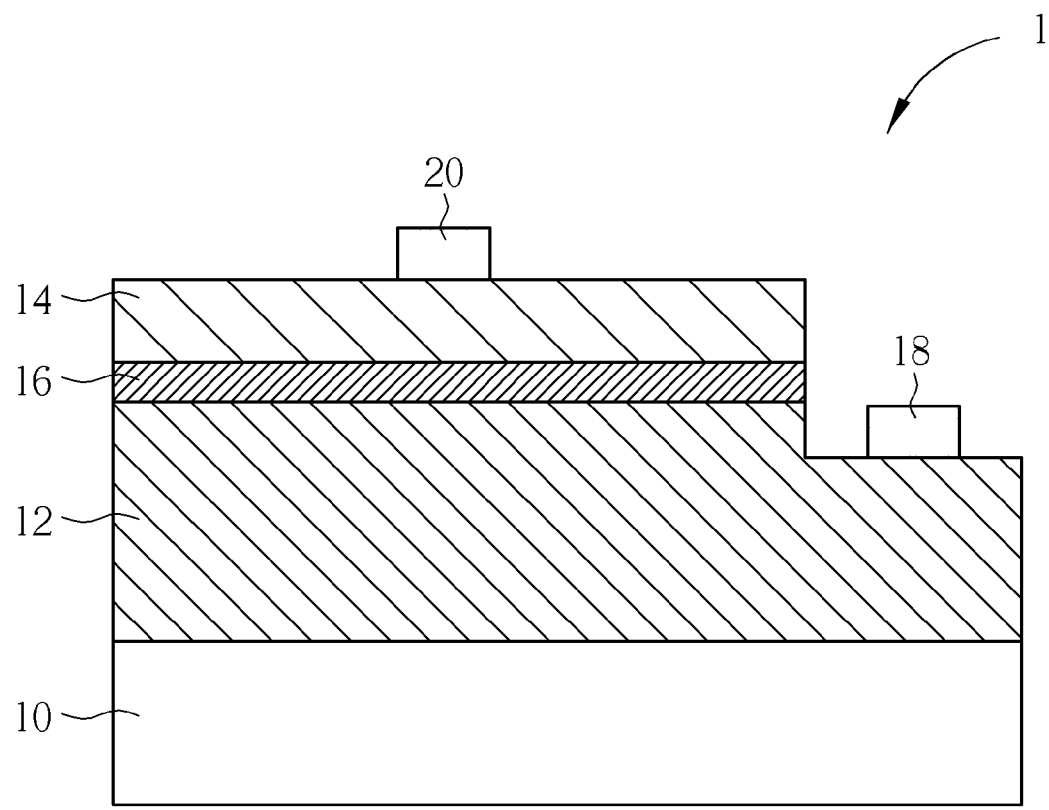
FIG. 1 is a schematic diagram illustrating a conventional light emitting diode.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . " In addition, to simplify the descriptions and make it more convenient to compare between each embodiment, identical components are marked with the same reference numerals in each of the following embodiments. Please note that the figures are only for illustration and the figures may not be to scale. Additionally, the terms such as "first" and "second" in this context are only used to distinguish different components and do not constrain the order of generation.

Figure 2:
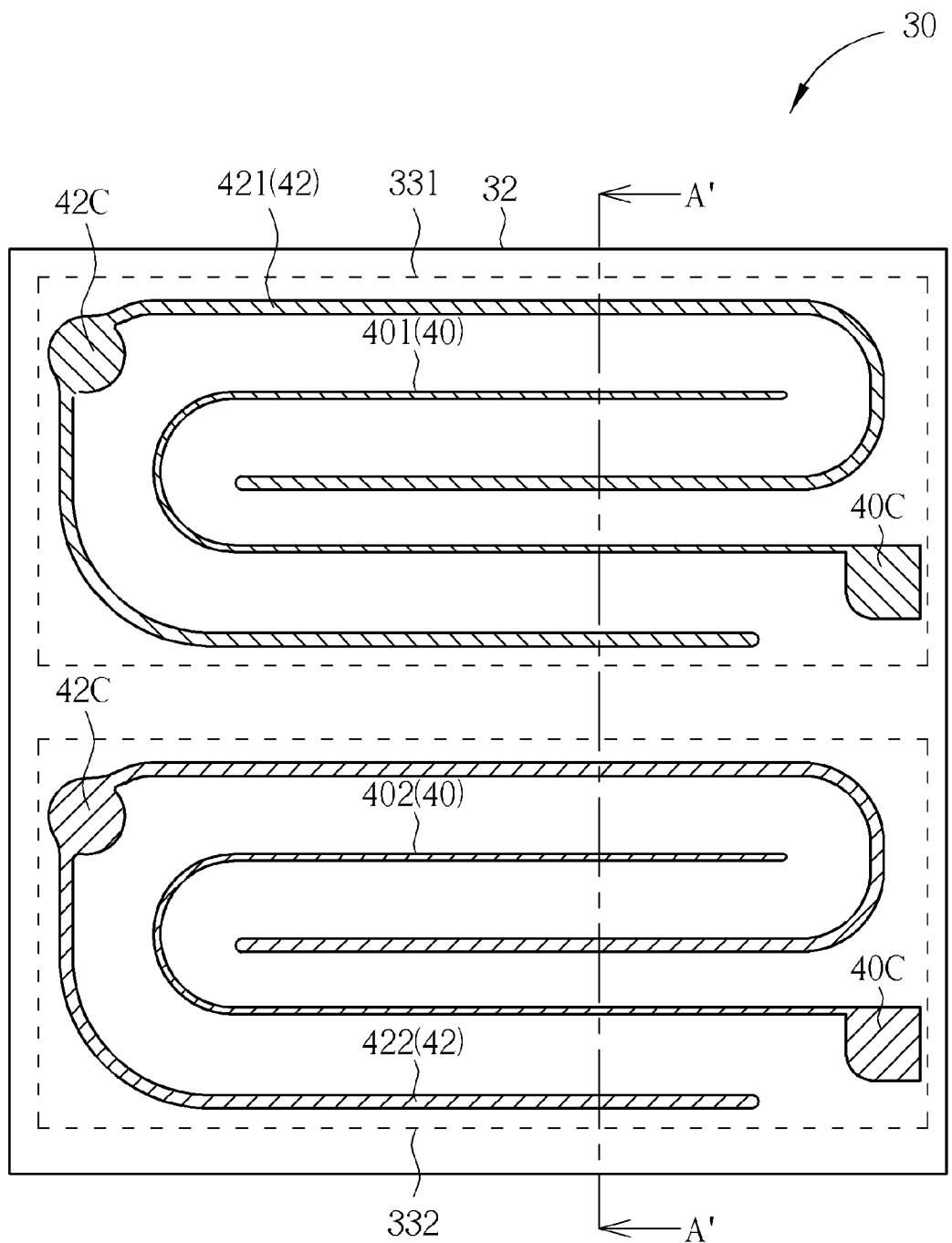
FIGS. 2-3 are schematic diagrams illustrating a light emitting diode according to a preferred embodiment of the present invention.
Figure 3:
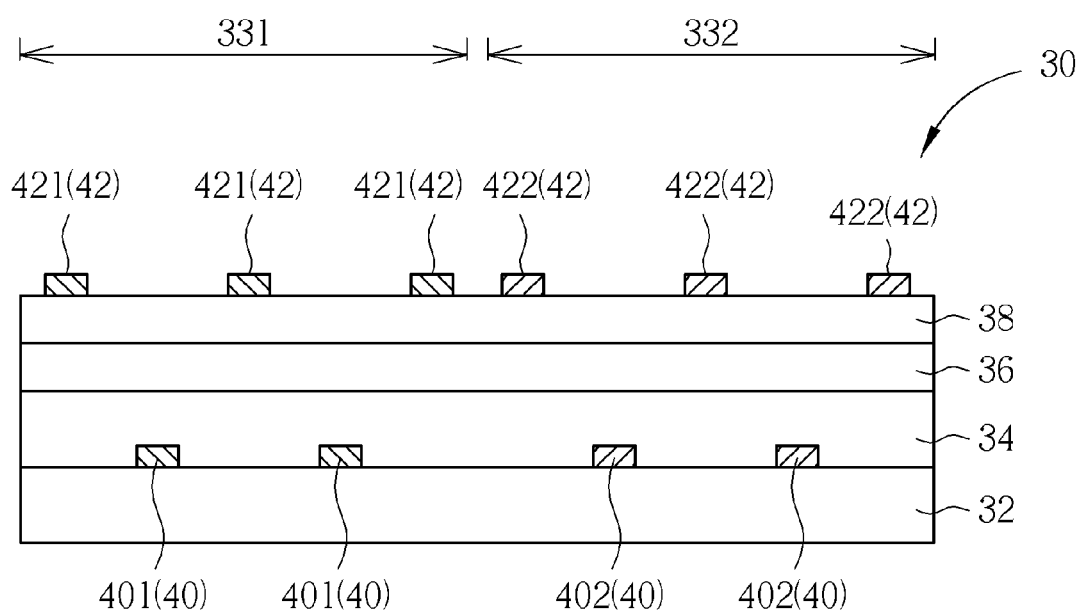

Please refer to FIG. 2 and FIG. 3. FIG. 2 and FIG. 3 are schematic diagrams illustrating a light emitting diode according to a preferred embodiment of the present invention, wherein FIG. 2 is a schematic diagram illustrating a top view of the light emitting diode, and FIG. 3 is a schematic diagram illustrating a cross-sectional view of the light emitting diode along the line A-A' in FIG. 2. As shown in FIG. 2 and FIG. 3, the light emitting diode 30 of this embodiment comprises a substrate 32, a first doped layer 34 disposed on the substrate 32, an active layer 36 disposed on the first doped layer 34, a second doped layer 38 disposed on the active layer 36, a first patterned electrode layer disposed between the first doped layer 34 and the substrate 32, and a second patterned electrode layer disposed on the second doped layer 38. The first patterned electrode layer comprises a plurality of electrodes 40, such as a first electrode 401 and a second electrode 402, and the first electrode 401 and the second electrode 402 are electrically connected to the first doped layer 34. The second patterned electrode layer comprises a plurality of electrodes 42, such as a third electrode 421 and a fourth electrode 422, and the third electrode 421 and the fourth electrode 422 are electrically connected to the second doped layer 38. The electrode 40 and the electrode 42 respectively comprise a contact pad 40C and a contact pad 42C. The contact pad 40C and the contact pad 42C are used as electrically connecting points in a following packing process to be connected to outside circuits. In addition, the substrate 32 comprises a plurality of loop regions, such as a first loop region 331 and a second loop region 332. The first electrode 401 and the third electrode 421 correspond to the first loop region 331, and the second electrode 402 and the fourth electrode 422 correspond to the second loop region 332. Additionally, the first doped layer 34 corresponds to the first loop region 331 and the second loop region 332, the active layer 36 corresponds to the first loop region 331 and the second loop region 332, and the second doped layer 38 corresponds to the first loop region 331 and the second loop region 332.

The substrate 32 may be a sapphire substrate, but the substrate 32 is not limited to this and may be other substrate, such as a glass substrate, a gallium phosphide (GaP) substrate, a gallium arsenide phosphide (GaAsP) substrate, a zinc selenide (ZnSe) substrate, a zinc sulfide (ZnS) substrate, a zinc sulfoselenide (ZnSSe) substrate, or a silicon carbide (SiC) substrate. The first doped layer 34, the active layer 36, and the second doped layer 38 may respectively be an epitaxy layer, such as a gallium nitride (GaN) epitaxy layer, but the present invention is not limited to this. A material of the electrode 40 and the electrode 42 may be a conductive material with high conductivity, such as a metal, an alloy, or a metal oxide, but the material of the electrode 40 and the electrode 42 is not limited to this and may be a single material or a composite material. In this embodiment, the first doped layer 34 is an N-doped layer (such as N-typed gallium nitride layer), and the second doped layer 38 is a P-doped layer (such as P-typed gallium nitride layer). In this situation, the electrode 40 is used as a cathode, and the electrode 42 is used as an anode, but the present invention is not limited to this. In this embodiment, the first electrode 401 and the second electrode 402 respectively comprise winding (coiled) patterns disconnected to each other, and the third electrode 421 and the fourth electrode 422 respectively comprise winding patterns disconnected to each other (as shown in FIG. 2). The first electrode 401 and the third electrode 421 wind in the first loop region 331, and the second electrode 402 and the fourth electrode 422 wind in the second loop region 332. In other words, patterns of the first electrodes 401 and patterns of the third electrodes 421 meander in the first loop regions 331, and patterns of the second electrodes 402 and patterns of the fourth electrodes 422 meander in the second loop regions 332. Because of this design, when the light emitting diode 30 is driven, the distribution of the currents may be more uniform and the uniformity of luminance and the luminous efficacy may be enhanced. In the present invention, although the first electrode 401 and the second electrode 402 respectively comprise winding patterns disconnected to each other, the first electrode 401 and the second electrode 402 may be connected to an identical outside voltage source or be connected to different outside voltage sources through the contact pad 40C, depending on different selections of design. Based on the same rule, although the third electrode 421 and the fourth electrode 422 respectively comprise winding patterns disconnected to each other, the third electrode 421 and the fourth electrode 422 may be connected to an identical outside voltage source or be connected to different outside voltage sources through the contact pad 42C, depending on different selections of design. Additionally, it is worth noting that design of the patterns of the first electrode 401, the second electrode 402, the third electrode 421, and the fourth electrode 422 is not limited to this and may be modified as needed. For instance, spacing between the electrodes may be modified. Additionally, in a top-view direction, the first electrode 401 and the second electrode 402 may present a pattern of interlaced fingers, and the third electrode 421 and the fourth electrode 422 may present a pattern of interlaced fingers.

In the present invention, each of the cathodes forms a loop with a corresponding anode, and each of the loops is an independent loop. For example, in this embodiment, the first electrode 401 (cathode) and the third electrode 421 (anode) form a first loop, the second electrode 402 (cathode) and the fourth electrode (anode) 422 form a second loop, and the first loop and the second loop are two independent loops. More specifically, in the present invention, a single light emitting diode is divided into at least two loop regions. The first doped layer 34, the active layer 36, and the second doped layer 38 substantially are respectively a complete surface film covering all loop regions in the light emitting diode. Based on the independent loop formed by the independent cathode and the independent anode in each of the loop regions, the distribution of the currents may be more uniform, and the uniformity of luminance and the luminous efficacy may be enhanced. It is worth noting that the light emitting diode in the present invention is not limited to being divided into two loop regions, and the light emitting diode may be divided into three, four, or even more loop regions, depending on the size of the light emitting diode or other considerations. The light emitting diode may be divided into three, four, or even more loop regions, and the independent loops are formed by the cathodes and the anodes in each of the loop regions, for achieving the purpose of making the distribution of the currents to be more uniform to enhance the uniformity of luminance and the luminous efficacy.

In addition, for enhancing a light extracting rate of the light emitting diode, micro structures may be selectively formed in any surfaces of the substrate 32.

The light emitting diode of the present invention is not limited to the above-mentioned embodiment. The following description will detail another embodiment of the light emitting diode in the present invention. For conveniently comparing the dissimilarities between each embodiment and simplifying the description, the identical components are marked with the same reference numerals in each of the following embodiments, and the following description will detail the dissimilarities among different embodiments. The identical components will not be redundantly described.

Figure 4:
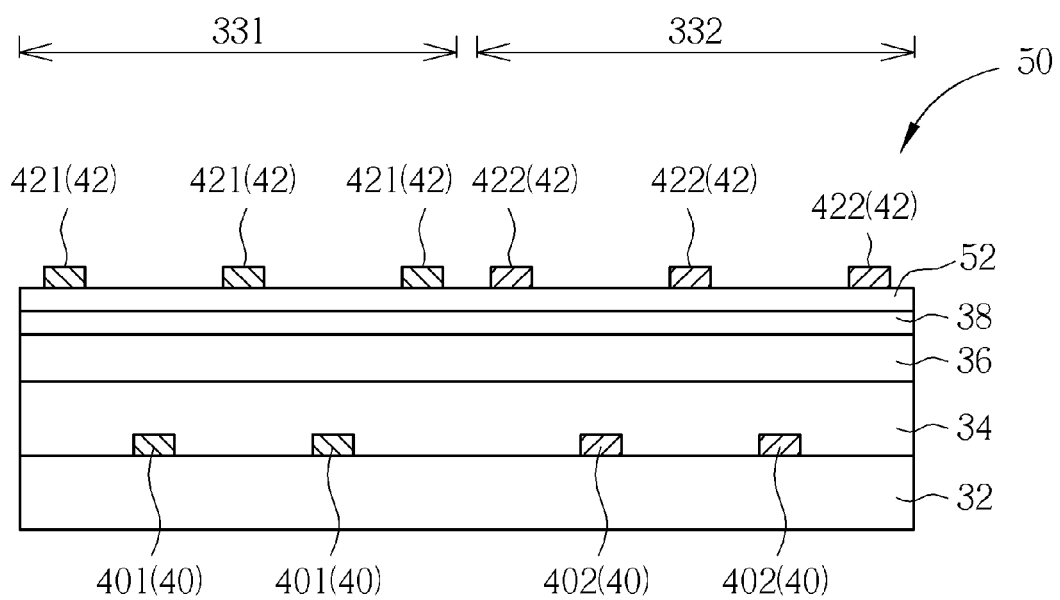
FIG. 4 is a schematic diagram illustrating a light emitting diode according to another preferred embodiment of the present invention.

Please refer to FIG. 4. FIG. 4 is a schematic diagram illustrating a light emitting diode according to another preferred embodiment of the present invention. As shown in FIG. 4, the light emitting diode 50 of the present invention further comprises a current spreading layer 52 disposed between the second doped layer 38 and the anodes, such as the third electrode 421 and the fourth electrode 422. The current spreading layer 52 may be a transparent conductive layer, such as indium tin oxide, to further improve the uniformity of the current distribution, which enhances the uniformity of luminance and the luminous efficacy.

To summarize all the descriptions above, the light emitting diode in the present invention comprises a plurality of loop regions, and an independent loop is formed by independent cathodes and independent anodes in each of the loop regions. Because of the independent loops, the distribution of the currents may be more uniform, and the uniformity of luminance and the luminous efficacy may be enhanced.

Those skilled in the art will readily observe that numerous modifications and alterations of the device and method may be made while retaining the teachings of the invention.

What is claimed is:

1. A light emitting diode, comprising:
    a substrate, comprising a first loop region and a second loop region;
    a first doped layer, disposed on the substrate;
    a first electrode and a second electrode, disposed between the first doped layer and the substrate, wherein the first electrode and the second electrode are electrically connected to the first doped layer, and a pattern of the first electrode is disconnected from a pattern of the second electrode;
    an active layer, disposed on the first doped layer, wherein the active layer corresponds to the first loop region and the second loop region, and the active layer is a complete surface film covering the first loop region and the second loop region;
    a second doped layer, disposed on the active layer; and
    a third electrode and a fourth electrode, disposed on the second doped layer, wherein the third electrode and the fourth electrode are electrically connected to the second doped layer, and a pattern of the third electrode is disconnected from a pattern of the fourth electrode, wherein the first electrode, the second electrode, the third electrode, and the fourth electrode respectively comprise a contact pad, the contact pads of the first electrode and the second electrode are disposed on one side of the light emitting diode, and the contact pads of the third electrode and the fourth electrode are disposed on an opposite side of the light emitting diode;
    wherein the first electrode and the third electrode correspond to the first loop region, the second electrode and the fourth electrode correspond to the second loop region, and the first electrode, the second electrode, the third electrode, and the fourth electrode are disconnected from each other.

2. The light emitting diode of claim 1, wherein the first doped layer is an N-doped layer, and the second doped layer is a P-doped layer.

3. The light emitting diode of claim 2, wherein the first electrode and the second electrode are cathodes, and the third electrode and the fourth electrode are anodes.

4. The light emitting diode of claim 1, further comprising a current spreading layer disposed between the second doped layer and the third electrode and between the second doped layer and the fourth electrode.

5. The light emitting diode of claim 1, wherein the first doped layer corresponds to the first loop region and the second loop region, and the second doped layer corresponds to the first loop region and the second loop region.

6. The light emitting diode of claim 1, wherein the first electrode and the second electrode respectively comprise winding patterns disconnected from each other, and the third electrode and the fourth electrode respectively comprise winding patterns disconnected from each other.

7. A light emitting diode, comprising:
    a substrate, comprising a plurality of loop regions;
    an N-doped layer, disposed on the substrate;
    a plurality of cathodes, disposed between the N-doped layer and the substrate, wherein the cathodes are electrically connected to the N-doped layer, and patterns of the cathodes are disconnected from each other;
    an active layer, disposed on the N-doped layer, wherein the active layer corresponds to the loop regions, and the active layer is a complete surface film covering the loop regions;
    a P-doped layer, disposed on the active layer; and
    a plurality of anodes, disposed on the P-doped layer, wherein the anodes are electrically connected to the P-doped layer, patterns of the anodes are disconnected from each other, and each of the cathodes and the corresponding anode respectively correspond to a corresponding loop region;
    wherein each of the cathodes and each of the anodes respectively comprise a contact pad, the contact pads of the anodes are disposed on one side of the light emitting diode, and the contact pads of the cathodes are disposed on an opposite side of the light emitting diode.

8. The light emitting diode of claim 7, further comprising a current spreading layer disposed between the P-doped layer and the anodes.

9. The light emitting diode of claim 7, wherein the N-doped layer corresponds to the loop regions and the P-doped layer corresponds to the loop regions.

10. The light emitting diode of claim 7, wherein each of the cathodes comprises a winding pattern, the winding patterns of the cathodes are disconnected from each other, each of the anodes comprises a winding pattern, and the winding patterns of the anodes are disconnected from each other.

* * * * *